United States Patent [19]

Sakamoto et al.

[11] 4,320,364
[45] Mar. 16, 1982

[54] CAPACITOR ARRANGEMENT

[75] Inventors: Yukio Sakamoto, Fukui; Yoshio Arakawa, Takefu; Seiichi Takahashi, Fukui, all of Japan

[73] Assignee: Murata Manufacturing Co., Ltd., Japan

[21] Appl. No.: 155,208

[22] Filed: Jun. 2, 1980

[30] Foreign Application Priority Data

Jun. 11, 1979 [JP] Japan .............................. 54-79835[U]

[51] Int. Cl.³ ............................................. H03H 7/01
[52] U.S. Cl. .................................... 333/167; 333/185
[58] Field of Search ........................... 333/181–185, 333/167, 172, 174, 175, 176, 12, 81 R; 361/301–306, 311; 336/110

[56] References Cited

U.S. PATENT DOCUMENTS

| 2,270,169 | 1/1942 | Muller | 333/185 |
| 2,582,931 | 1/1952 | Kodama | 361/306 |
| 2,973,490 | 2/1961 | Schlicke | 333/81 X |
| 3,086,149 | 4/1963 | Baron | 361/301 |
| 3,111,612 | 11/1963 | Lehmann | 361/301 |

Primary Examiner—Marvin L. Nussbaum
Attorney, Agent, or Firm—Ostrolenk, Faber Gerb & Soffen

[57] ABSTRACT

A capacitor arrangement for use in filtering high frequency noises includes a dielectric disc plate and electrodes deposited on opposite flat surfaces of the disc plate. A terminal leg extends from one electrode for the connection with ground, and two terminal legs extend from the other electrode for the connection with consecutive lead lines. The terminal legs connected with the consecutive lead lines are mounted with magnetic elements for increasing the inductance in the terminal legs.

10 Claims, 25 Drawing Figures

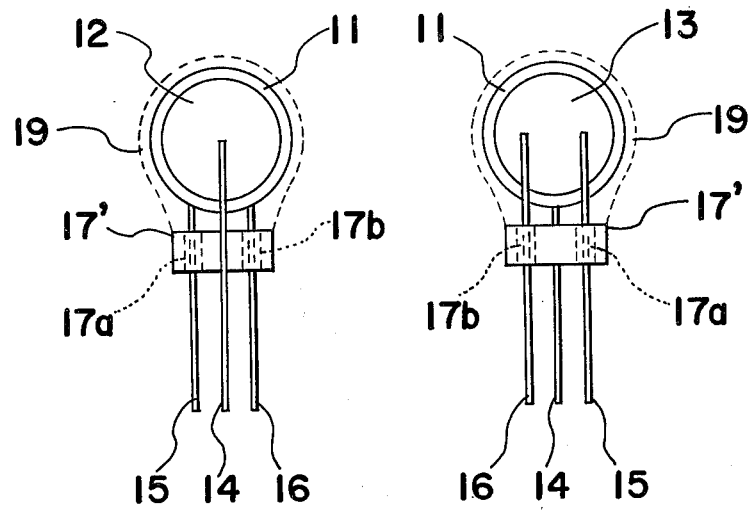

CAPACITOR ARRANGEMENT

BACKGROUND OF THE INVENTION

The present invention relates to a capacitor and, more particularly, to a capacitor arrangement for filtering noise having a high frequency, such as several tens of mega hertz.

Lead lines for transmitting signals often pick up high frequency noise signals. For example, when the lead line is disposed near a source of a high frequency signal, it picks up the high frequency noise electromagnetically. To eliminate such high frequency noise, a capacitor, such as shown in FIG. 1, is generally connected between the lead line and ground.

The capacitor of FIG. 1 constitutes a ceramic dielectric plate 1, a pair of electrodes 2 and 3 deposited on opposite surfaces of the plate 1, respectively, a pair of terminal legs 4 and 5 extending from the electrodes 2 and 3, respectively, and a synthetic resin coating 6 covering the capacitor for insulation purposes. An equivalent circuit of the capacitor of FIG. 1, when it is connected between the lead line A and ground, is shown in FIG. 2, in which a capacitor C represents capacitance between the electrodes 2 and 3 while inductors L4 and L5 represent inductances of the terminal legs 4 and 5, respectively. When the signals having various frequencies are transmitted through the lead line A, a signal having a certain high frequency is filtered to ground through an L-C filter circuit including the capacitor C and inductors L4 and L5, while the remaining signals are transmitted through the lead line A without any disturbances. The frequency of the signal filtered through the L-C circuit is determined by both the capacitance and inductance between the lead line A and ground. Accordingly, the inductance of the terminal legs 4 and 5 greatly influences the determination of the signal that can be filtered through the L-C circuit. From the view point of practice, the inductance in the L-C circuit should preferably be as low as possible. However, in the capacitor of FIG. 1 the inductors L4 and L5 have such a high inductance that only signals having a considerably low frequency, compared with that of the high frequency noise, are filtered. Therefore, the high frequency noise signals can not be effectively filtered by the capacitor of FIG. 1. Instead, necessary signals (i.e. non-noise signals) may be undesirably filtered to the ground.

To effectively filter the high frequency noise signals, it is necessary to reduce the inductance in the L-C filter circuit. To this end, a capacitor shown in FIG. 3 has been proposed. Instead of the long terminal legs, the capacitor of FIG. 3 has a ribbon-shaped terminal member 7 soldered to the electrode 3, and a screwed terminal member 8 soldered to the other electrode 2. When in use, the screwed terminal member 8 is screwed into a base 9 for grounding the electrode 2 while the ribbon-shaped terminal member 7 is connected in series with the lead line A. Particularly, one wing portion of the ribbon-shaped terminal member 7 is connected to the lead line A' and the other wing portion thereof is connected to a consecutive lead line A''. Thereafter, the electrode 3 and a part of the ribbon-shaped terminal member 7 are covered by a synthetic resin 10. An equivalent circuit of the capacitor of FIG. 3 is shown in FIG. 4 in which inductors L7' and L7'' represent inductances in the wing portions of the ribbon-shaped terminal member 7 while an inductor L8 represents inductance in the screwed terminal member 8. As understood from the equivalent circuit of FIG. 4, the L-C filter circuit is defined by the capacitor C and the inductor L8. The inductors L7' and L17'' serve as inductive impedances in the successive lead lines A' and A''. Thus, the L-C filter presents a considerably low inductance and thereby effectively filters the high frequency noise signals in line A.

Although the capacitor of FIG. 3 effectively eliminates high frequency noise signals, it is costly to manufacture because of the particular shaped terminal members and its time consuming task for the installation. Furthermore, it occupies a large space when it is installed in a device.

Accordingly, a primary object of the present invention is to provide a capacitor arrangement which effectively filters high frequency noises.

It is another object of the present invention to provide a capacitor arrangement of the above described type which is simple in construction and can readily be manufactured at low cost.

BRIEF DESCRIPTION OF THE INVENTION

In accomplishing these and other objects of the invention, a capacitor arrangement for filtering high frequency noise in a lead line and bypassing the filtered signal to ground, according to the present invention comprises a dielectric body deposited with first and second electrodes for presenting a predetermined capacitance between the first and second electrodes. A first terminal member is electrically connected to the first electrode for the external electrical connection with ground. Second and third terminal members are electrically connected to the second electrode. The second terminal member is provided for the external electrical connection with a lead line, and the third terminal member is provided for the external electrical connection with a consecutive lead line. The capacitor arrangement of the present invention further comprises a magnetic element mounted at least on one of the second and third terminal members for increasing the inductance in the corresponding terminal member mounted with the magnetic element.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which:

FIGS. 12a and 12b are front and back schematic plan views of a capacitor arrangement according to a third embodiment of the present invention;

FIG. 13 is a schematic view showing a manner in which the capacitor arrangement of FIGS. 12a and 12b is mounted on the circuit board;

DETAILED DESCRIPTION OF THE INVENTION

Figure 1:
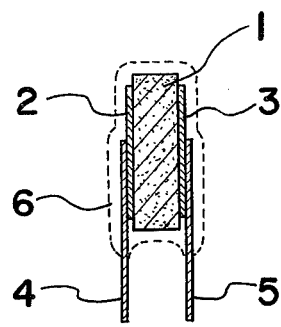
FIG. 1 is a cross-sectional view of a first capacitor arrangement according to the prior art.
Figure 2:
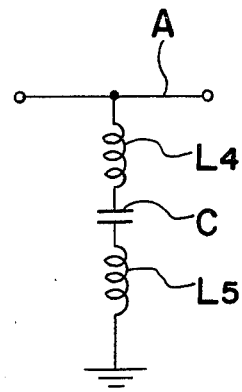
FIG. 2 is an equivalent circuit diagram of the capacitor arrangement shown in FIG. 1.
Figure 3:
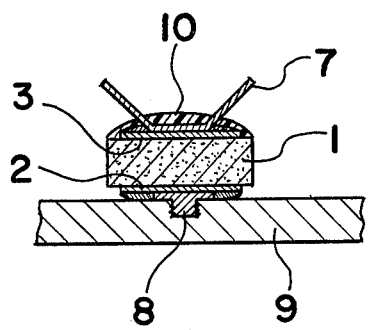
FIG. 3 is a cross-sectional view of a second capacitor arrangement according to another prior art.
Figure 4:
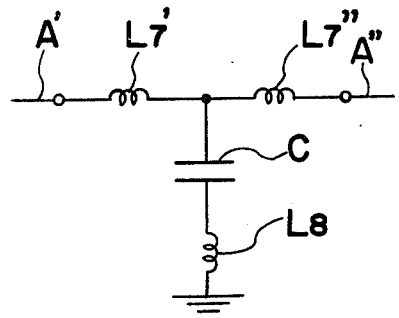
FIG. 4 is an equivalent circuit diagram of the capacitor arrangement shown in FIG. 3.
Figure 5A:
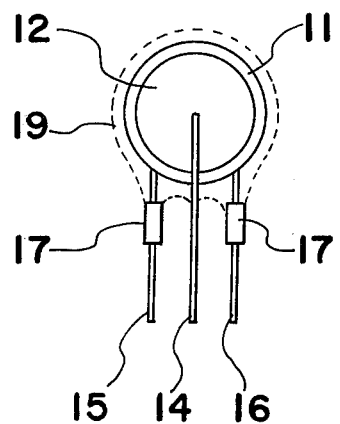
FIGS. 5a and 5b are front and back schematic plan views of a capacitor arrangement according to a first embodiment of the present invention.
Figure 5B:
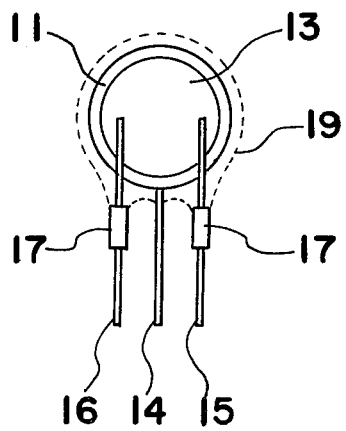

Referring to FIGS. 5a and 5b, a capacitor arrangement of the present invention comprises a dielectric body 11 defined by a disc-shaped plate and a pair of electrodes 12 and 13 deposited on opposite flat surfaces of the plate 11. A first terminal leg 14 is attached to the first electrode 12 by the application of solder or conductive bonding agent in such a manner as to overlap one end portion of the terminal leg 14 with the first electrode 12 and to laterally extend the remaining portion outwardly from the plate 11. Second and third terminal legs 15 and 16 are attached to the second electrode 13 in a similar manner to overlap one end portion of the respective terminal legs 15 and 16 with the second electrode 12 and to laterally extend their remaining portions outwardly from the plate 11. It is preferable to direct the three terminal legs 14, 15 and 16 in the same direction.

Figure 6:
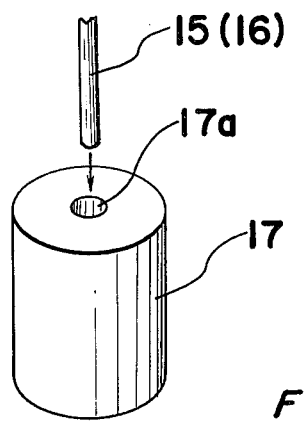
FIG. 6 is a perspective view of a magnetic member employed in the capacitor arrangement of FIGS. 5a and 5b.

A cylindrical element 17 made of a magnetic material, such as ferrite, and having a bore 17a extending axially therethrough (FIG. 6) is mounted on at least one of the second and third terminal legs 15 and 16 to increase the inductance in the corresponding terminal leg with the element 17. In the embodiment shown in FIGS. 5a and 5b, the cylindrical element 17 is mounted on both terminal legs 15 and 16 at an intermediate portion of each leg to locate the cylindrical element 17 apart from the plate 11. Since the bore 17a in the cylindrical element 17 has a diameter greater than that of the respective terminal legs 15 and 16, the intermediate portion of the respective terminal legs 15 and 16 at which the cylindrical element 17 is mounted is bent in a shape of waves (not shown) to hold the cylindrical element 17 in the mounted position. Instead of forming the waves, a bonding agent can be filled in the bore 17a, or a ring (not shown) can be rigidly mounted on the terminal leg for supporting the element 17.

After the element 17 is placed on the terminal leg, a synthetic resin coating 19 is applied by dipping so as to insulate the capacitor. It is preferable to apply the coating 19 over a portion of the cylindrical element 17 to maintain the element 17 in the mounted position.

Figure 7:
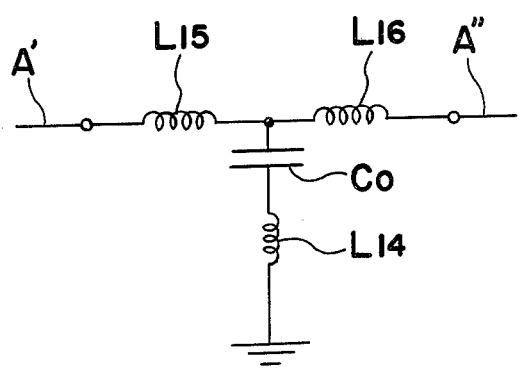
FIG. 7 is an equivalent circuit diagram of the capacitor arrangement shown in FIGS. 5a and 5b.

When in use, the first terminal leg 14 is connected to ground and the second terminal leg 15 is connected to a lead line A' (FIG. 7) carrying the high frequency noise. The third terminal leg 16 is connected to a consecutive lead line A" (FIG. 7). An equivalent circuit of the capacitor arrangement according to the present invention is shown in FIG. 7 in which a capacitor Co represents a capacitance between the electrodes 12 and 13 and inductors L14, L15 and L16 represent inductances in the terminal legs 14, 15 and 16, respectively. The capacitor Co and the inductor L14 connected in series betweeen the lead line and ground define an L-C filter circuit. Since the inductors L15 and L16 are not included in the L-C filter circuit, the inductance in the L-C circuit is considerably low. The inductors L15 and L16 connected in series in the lead line serve as an inductive impedance. Since the terminal legs 15 and 16 have the magnetic element 17 mounted thereon, the inductors L15 and L16 have considerably high inductance.

When signals are transmitted through the lead line, e.g., from left to right in the circuit of FIG. 7, the high frequency noise is first reduced by an inductive impedance in the inductor L15. The reduced high frequency noise which have passed through the inductor L15 is than bypassed to the ground through the L-C filter circuit of capacitor Co and inductor L14. At this point, the high frequency noise in the lead line is almost completely eliminated. The inductor L16 further reduces the remaining high frequency noises by its inductive impedance. Therefore, the signals produced from the inductor L16 contain hardly any high frequency noises.

Figure 8:
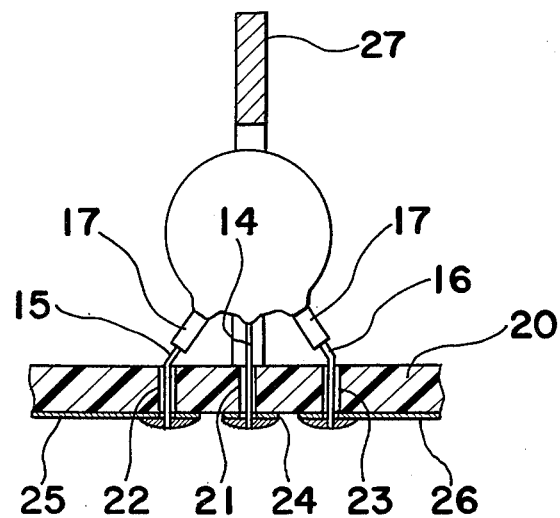
FIG. 8 is a schematic view showing a manner in which the capacitor arrangement of FIGS. 5a and 5b is mounted on a circuit board.
Figure 9:
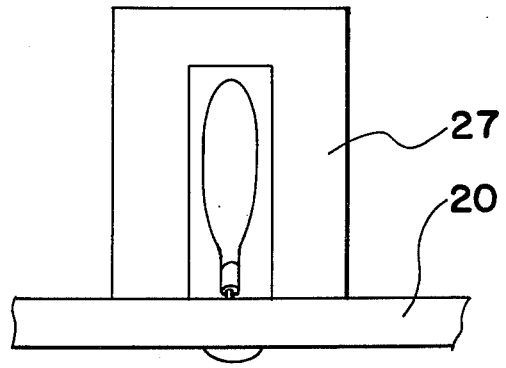
FIG. 9 is a side plan view showing a manner in which a shield plate is disposed around the capacitor arrangement of FIGS. 5a and 5b.

Referring to FIGS. 8 and 9, there is shown a manner in which the capacitor arrangement of the present invention is mounted on a circuit board 20. The circuit board 20 made of synthetic resin has three holes 21, 22 and 23 formed in its thickness direction and in alignment with each other, and runner electrodes 24, 25 and 26 extending from openings of the holes 21, 22 and 23, respectively. The runner electrodes 25 and 26 correspond to the consecutive lead lines A' and A" for transmitting signals. The runner electrode 24 is connected to ground. To mount the capacitor arrangement, the terminal legs 14, 15 and 16 are inserted into the holes 21, 22 and 23, respectively, and then each end of the terminal legs projecting from the board 20 is soldered to the corresponding runner electrode. It is preferable to insert the terminal leg 14 as deep as possible to shorten the length thereof. To prevent the high frequency signal from being propagated through a surrounding area about the capacitor arrangement between the terminal legs 15 and 16, a shield plate 27 made of metal is installed around the capacitor arrangement in a manner shown in FIGS. 8 and 9.

Since the capacitor arrangement according to the present invention has a simple structure, it can be manufactured at low cost. Furthermore, since the inductor L14 in the L-C circuit has low inductance while the inductors L15 and L16 have high inductance, and high frequency noise can be effectively eliminated by the inductive impedance of the inductors L15 and L16 and also by the L-C filter circuit.

The description is now directed to other embodiments and modifications of the present invention.

SECOND EMBODIMENT

Figure 10A:
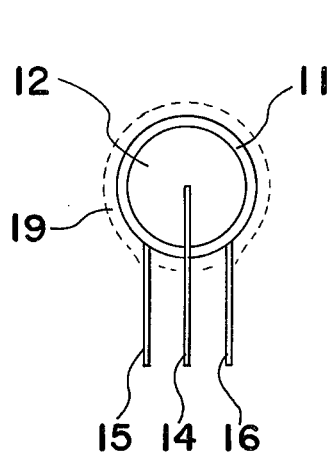
FIGS. 10a and 10b are front and back schematic plan views of a capacitor arrangement according to a second embodiment of the present invention.
Figure 10B:
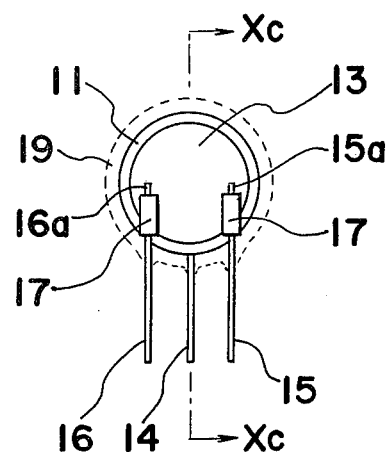
Figure 10C:
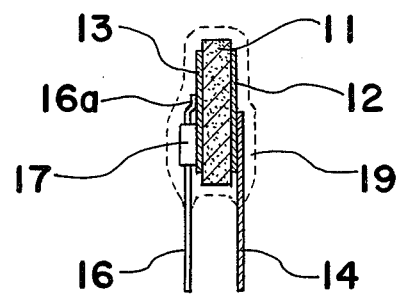
FIG. 10c is a cross-sectional view taken along a line Xc—Xc shown in FIG. 10b.

Referring to FIGS. 10a to 10c, a capacitor arrangement in this embodiment has each cylindrical magnetic element 17 mounted at a portion close to one end portion 15a, 16a of the respective terminal legs 15 and 16. Accordingly, each cylindrical magnetic element 17 is placed in contact with the second electrode 13 to enable the respective terminal leg to project outwards from the dielectric body 11 without any detent which would be present when the elements 17 are mounted in the manner such as shown in FIGS. 5a and 5b. The electrical connection between the end portion 15a, 16a and the second electrode 13 can be carried out by the deposition of a solder bead therebetween. When the distance between the end portion 15a, 16a and the second electrode 13 is considerably long, due to a large diameter of the element 17, it is preferable to bend the end portion 15a, 16a towards the second electrode 13, as shown in FIG. 10c. The attachment of the cylindrical magnetic element 17 over the second electrode 13 can be carried out by the use of a bonding agent. If a bonding agent is not used, the magnetic element 17 can still be held in position when the coating 19 is applied.

Figure 11:
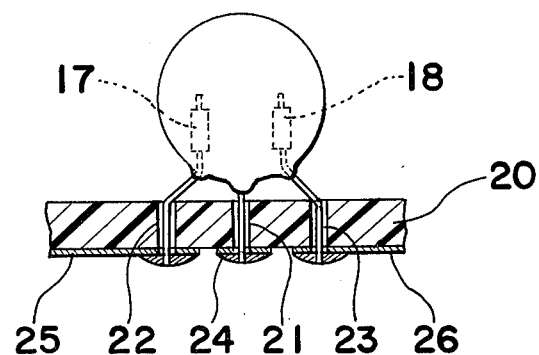
FIG. 11 is a schematic view showing a manner in which the capacitor arrangement of FIGS. 10a and 10b is mounted on a circuit board.

Since the terminal legs 14, 15 and 16 according to this embodiment have no detent or hindrance, they can be deeply inserted into the holes formed in the circuit board 20, as shown in FIG. 11, so that the length of the terminal leg 14 can be shortened to a length equal to the thickness of the circuit board 20. Accordingly, the inductor L14 constituting the L-C filter circuit can be reduced by considerably small amount to permit the L-C circuit to filter high frequency noise.

Third Embodiment

Referring to FIGS. 12a and 12b, a capacitor arrangement in this modification has a magnetic element 17' provided with two bores 17a and 17b formed therethrough parallel to each other for inserting the terminal legs 15 and 16. According to this arrangement, it is possible to reduce the number of parts required to construct the capacitor arrangement, a compared to the previous embodiments. Therefore, it is possible to reduce the manufacturing steps thereof. FIG. 13 shows a manner in which the capacitor arrangement according to the third embodiment is mounted on the circuit board 20.

Fourth Embodiment

Figure 14A:
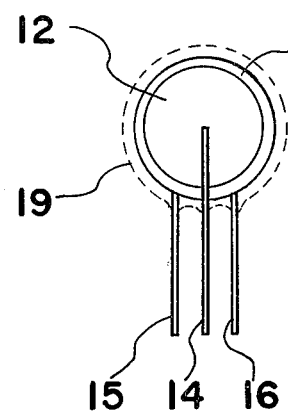
FIGS. 14a and 14b are front and back schematic plan views of a capacitor arrangement according to a fourth embodiment of the present invention.
Figure 14B:
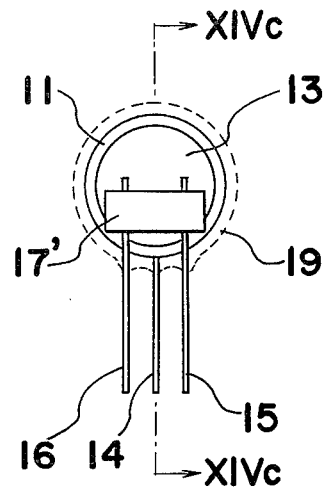
Figure 14C:
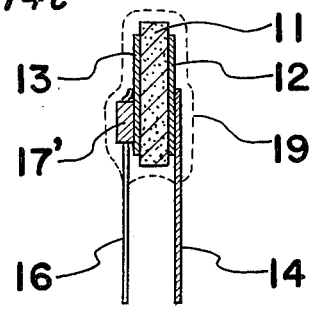
FIG. 14c is a cross-sectional view taken along a line XIVc—XIVc shown in FIG. 14b.
Figure 15:
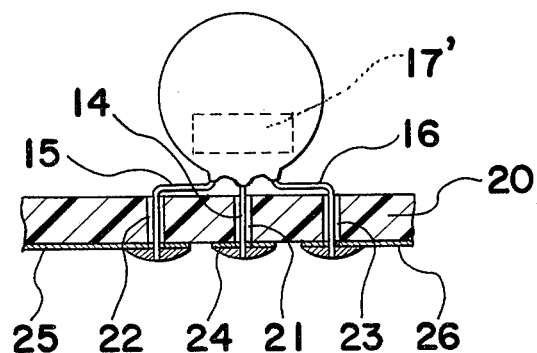
FIG. 15 is a schematic view showing a manner in which the capacitor arrangement of FIGS. 14a and 14b is mounted on a circuit board.

Referring to FIGS. 14a, 14b and 14c, the magnetic element 17' is placed in contact with the second electrode 13 in a manner similar to the second embodiment so as to project the respective terminal legs from the dielectric body 11 without any detent. According to this arrangement, the terminal leg 14, when mounted on the circuit board 20 as shown in FIG. 15, can be shortened to a length equal to the thickness of the circuit board 20 for minimizing the inductance in the terminal leg 14.

Modifications

Referring to FIGS. 16 to 19, there are shown various modifications of the capacitor arrangement according to the present invention.

Figure 16:
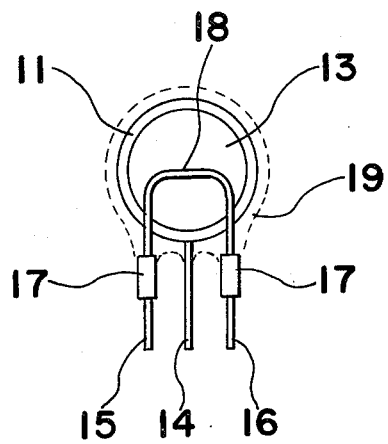
FIGS. 16 to 19 are schematic plan views of various capacitor arrangement showing different modifications of the arrangement.

Referring particularly to FIG. 16, a capacitor arrangement in this modification has a bar 18 made of metal extending between the ends opposite to the projecting ends of the respective terminal legs 15 and 16. Preferably, the terminal legs 15 and 16, and the bar 18 are formed by a single bar bent in a shape of U. When the bar 18 is not provided, as in any one of the previous embodiments, the signal applied to the terminal leg 15 is transmitted to the terminal leg 16 through the electrode 13. In this case, if there is some electrical resistance between the electrode 13 and the respective terminal leg 14 and/or 15, due to incomplete soldering therebetween the signal may be undesirably reduced and, moreover, a heat may be produced by the resistance. If the terminal legs 15 and 16 are provided integrally (as shown in FIG. 16), on the other hand, no electrical resistance will be produced between the terminal legs 15 and 16.

Figure 17:
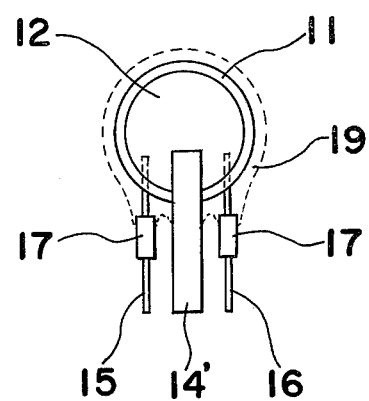

Referring to FIG. 17, a capacitor arrangement of this modification employs a terminal leg 14' having a wide width. When this terminal leg 14' is employed, a considerably large area can be used for the contact between the electrode 12 and the terminal leg 14' to ensure the high electrical conductivity therebetween. Furthermore, the employment of the strip shaped terminal leg 14' results in reduction of the inductance in the terminal leg 14'.

Figure 18:
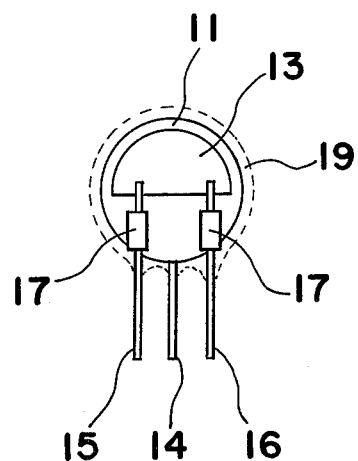
Figure 19:
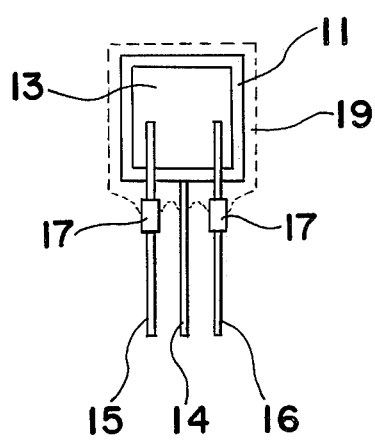

Many further variations of the preferred embodiments and modifications are possible. For example, the electrode 13 can be provided approximately half the surface of the dielectric body 11 to allow a direct attachment of the magnetic element onto the dielectric body 11, as shown in FIG. 18, or the configuration of the dielectric body can be formed in a shape other than the disc shape, such as, a rectangular shape, as shown in FIG. 19.

While there has been described what is at present considered to be the preferred embodiments of the invention, it will be understood that various modifications may be made therein, and it is intended to cover in the appended claims all such modifications as fall within the true scope of the invention.

What is claimed is:

1. A capacitor arrangement for filtering high frequency noise signals in a lead line and bypassing the filtered noise signals to ground, comprising:
    (a) a dielectric body formed in the shape of a plate having opposite flat surfaces;
    (b) first and second electrodes deposited on respective said opposite flat surfaces of said dielectric body such that a predetermined capacitance is defined between said first and second electrodes;
    (c) a first terminal member electrically connected to said first electrode, said first terminal member partly overlapping said first electrode and extending laterally outward from said dielectric plate;
    (d) second and third terminal members electrically connected to said second electrode, each of said second and third terminal members partly overlapping said second electrode and extending laterally outward from said dielectric plate; and
    (e) first and second magnetic elements mounted on said second and third terminal members, respectively, to increase the inductance of the respective terminal member on which it is mounted.

2. A capacitor arrangement as claimed in claim 1, wherein said first magnetic element is mounted at an intermediate portion of the said second terminal member so as to locate said first magnetic element apart from said dielectric plate.

3. A capacitor arrangement as claimed in claim 1, wherein said first magnetic element is mounted at a portion of said second terminal member which overlaps the second electrode so as to project said second terminal member away from the dielectric plate without any detent.

4. A capacitor arrangement as claimed in claim 3, wherein said portion of said second terminal member is bent in a shape of L and forms an electrical connection between one end portion of said second terminal member and said second electrode.

5. A capacitor arrangement as claimed in claim 1, wherein said first magnetic element is formed in a shape of cylinder with a bore extending axially therethrough.

6. A capacitor arrangement as claimed in claim 1, wherein said first magnetic element mounted on said second terminal member is integrally formed with said second magnetic element mounted on said third terminal member.

7. A capacitor arrangement as claimed in claim 1, wherein said second and third terminal members are connected with each other at respective ends located over the second electrode.

8. A capacitor arrangement as claimed in claim 1, wherein said first terminal member is formed in a shape of strip.

9. A capacitor arrangement as claimed in claim 1, further comprising an insulative coating made of synthetic resin and covering a substantial portion of said capacitor arrangement.

10. A capacitor arrangement as claimed in claims 1, 2, 3, 4, 6, 7, 8 or 9, wherein said first terminal member is coupled to ground and said second and third terminal members are connected to respective lead lines.

* * * * *